(12) United States Patent
Takeda et al.

(10) Patent No.: US 6,503,416 B2
(45) Date of Patent: Jan. 7, 2003

(54) PIEZOELECTRIC CERAMIC COMPOSITION AND PIEZOELECTRIC CERAMIC ELEMENT USING THE SAME

(75) Inventors: Toshikazu Takeda, Omihachiman (JP); Yukio Sakabe, Kyoto (JP)

(73) Assignee: Murata Manufacturing Co. Ltd. (JP)

( * ) Notice: Subject to any disclaimer, the term of this patent is extended or adjusted under 35 U.S.C. 154(b) by 0 days.

(21) Appl. No.: 09/941,888

(22) Filed: Aug. 28, 2001

(65) Prior Publication Data

US 2002/0049130 A1 Apr. 25, 2002

(30) Foreign Application Priority Data

Aug. 28, 2000 (JP) ......................................... 2000-257883

(51) Int. Cl.[7] .............................................. C04B 35/00
(52) U.S. Cl. ................... 252/62.9 R; 501/134
(58) Field of Search ....................... 252/62.9 R; 501/134

(56) References Cited

FOREIGN PATENT DOCUMENTS

JP        51-120000        * 10/1976

OTHER PUBLICATIONS

English Abstract of JP 51–12000, Oct. 1976.*

* cited by examiner

*Primary Examiner*—Elizabeth D. Wood
(74) *Attorney, Agent, or Firm*—Dickstein, Shapiro, Morin & Oshinsky LLP

(57) ABSTRACT

A piezoelectric ceramic composition is provided that does not contain Pb, and yet has a large electromechanical coupling coefficient in comparison with a bismuth layered compound, as well as a piezoelectric ceramic element using the composition. This piezoelectric ceramic composition includes at least the elements Ag, Li, Nb, and O, and has an electromechanical coupling coefficient $k_{33}$ of not less than about 20%.

15 Claims, 1 Drawing Sheet

PIEZOELECTRIC CERAMIC COMPOSITION AND PIEZOELECTRIC CERAMIC ELEMENT USING THE SAME

BACKGROUND OF THE INVENTION

1. Field of the Invention

The present invention relates to a piezoelectric ceramic composition and a piezoelectric ceramic element using the composition. More particularly, the present invention relates to a piezoelectric ceramic composition useful as a material for piezoelectric ceramic elements such as piezoelectric ceramic filters and piezoelectric ceramic resonators, and to a piezoelectric ceramic element using the composition.

2. Description of the Related Art

Conventionally, piezoelectric ceramic compositions comprising lead titanate zirconate ($Pb(Ti_xZr_{1-x})O_3$) or lead titanate ($PbTiO_3$) as a main component are widely used for manufacturing piezoelectric elements such as piezoelectric ceramic filters. Recently, piezoelectric ceramic compositions comprising a bismuth layered compound such as $CaBi_4Ti_4O_{15}$ as a main component have also been developed.

Pb, however, is suspected as a material which might cause environmental problems and affects human bodies. On the other hand, piezoelectric ceramics comprising bismuth layered compounds as the main components are not widely used in practice since the electromechanical coupling coefficients $k_{33}$ are as small as less than 20%.

SUMMARY OF THE INVENTION

Therefore, it is an object of the present invention to provide a piezoelectric ceramic composition which does not contain Pb and which has an electromechanical coupling coefficient larger than that of a bismuth layered compound, and to provide a piezoelectric ceramic element using the composition.

A piezoelectric ceramic composition according to the present invention is characterized in that it comprises at least the elements Ag, Li, Nb, and O, and has an electromechanical coupling coefficient $k_{33}$ of not less than about 20%.

It is also characterized in that it comprises a main component represented by the general formula $(Ag_{1-x}Li_x)(Nb_{1-y}Ta_y)O_3$, wherein $0.075 < x < 0.40$ and $0 < y < 0.20$. In one embodiment, y=0 and the main component corresponds to $(Ag_{1-x}Li_x)NbO_3$. In another embodiment, y is greater than 0 and the main component corresponds to $(Ag_{1-x}Li_x)(Nb_{1-y}Ta_y)O_3$.

Furthermore, it is preferable that the composition comprises at least one of a manganese oxide and a silicon oxide as an auxiliary component. It is more preferable that the manganese oxide should be contained in an amount of not more than about 5 parts by weight based on 100 parts by weight of the main component, and that the silicon oxide should be contained in an amount of not more than about 5 parts by weight based on 100 parts by weight of the main component.

Furthermore, a piezoelectric ceramic element according to the present invention comprises a piezoelectric ceramic made from the piezoelectric ceramic composition according to the present invention, and an electrode formed on the piezoelectric ceramic.

In the general formula for the piezoelectric ceramic composition according to the present invention, a range of x<0.075 is not preferable since the transition temperature is decreased, across which a ferroelectric phase acting as a piezoelectric material turns into a paraelectric phase or an antiferroelectric phase which does not act as a piezoelectric material, with the result that there will be problems regarding the temperature stability of the elements composed of the piezoelectric ceramic composition. Also, when $0.40 \leq x$, the resonance frequency constant will be smaller than 2,000 Hz/m, and polarization will not occur easily. When y is not less than 0.20, the transition temperature will be decreased, too. Accordingly, the ranges of $0.075 \leq x < 0.40$ and $0 \leq y < 0.20$ are required in the present invention.

Furthermore, in the present invention, the baking temperature can be decreased by adding a manganese oxide or a silicon oxide to the main component. It is to be noted that it is preferable that the manganese oxide should be contained in an amount of not more than about 5 parts by weight based on 100 parts by weight of the main component, and that the silicon oxide should be contained in an amount of not more than about 5 parts by weight based on 100 parts by weight of the main component, so as not to degrade the properties that are achieved when no such materials are added.

Furthermore, the piezoelectric ceramic composition according to the present invention may be a solid solution, a mixture, a polycrystal or a single crystal.

The above-described objects, other objects, features, and advantages of the present invention will become more apparent from the following detailed explanations of the embodiments when taken in conjunction with the accompanying drawings, tables, and examples.

DESCRIPTION OF THE PREFERRED EMBODIMENTS

Figure 1:
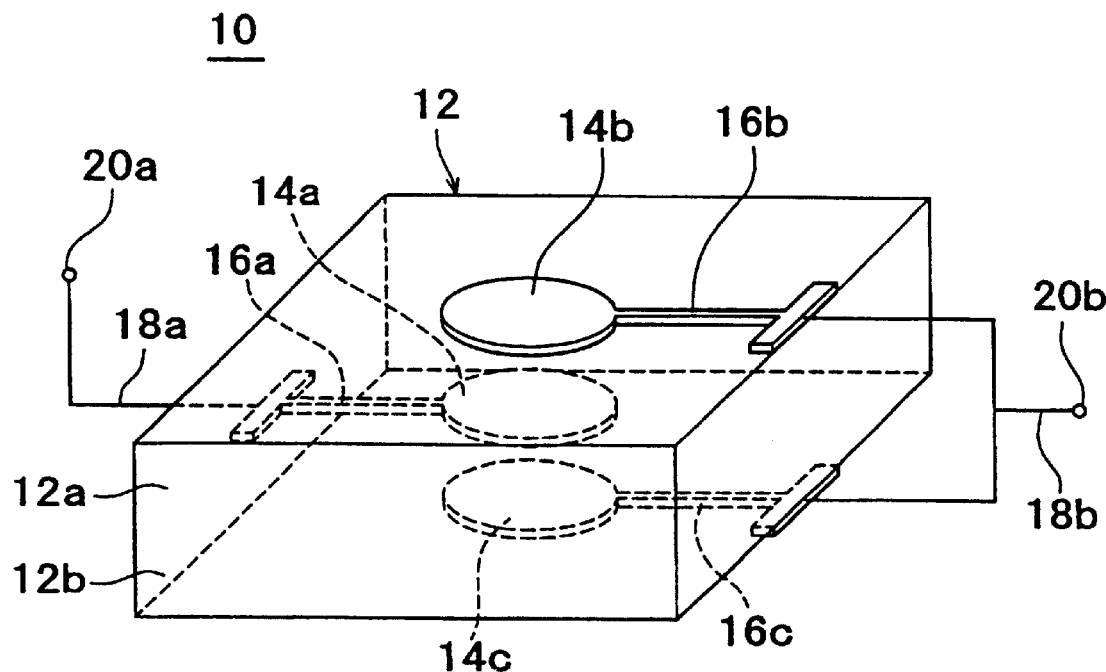
FIG. 1 is a perspective view showing an example of a piezoelectric ceramic resonator according to the present invention.

Although the present invention will be described with reference to the following drawings, tables and examples, it is to be understood that the invention is not limited to the precise embodiments described below, and various changes and modifications may be made to various usages and conditions without departing from the spirit and scope of the invention as described in the claims that follow.

The piezoelectric ceramic composition according to the present invention can be manufactured in the same way as is applied to manufacturing of conventional ferroelectric materials and dielectric materials. For example, specific amounts of $Ag_2O$, $Nb_2O_5$, $Ta_2O_5$ and $Li_2CO_3$ are first weighed out and blended together in a solvent such as water or ethanol, using zirconia balls or similar media for from 4 to 24 hours. A dispersing agent such as a sorbitan ester may be added for achieving more homogeneous blending. After that, the slurry thus blended is dried and then subjected to calcination in an oxidizing atmosphere at from 800 to 1,100° C. for from 1 to 24 hours using a common electric furnace. The calcined product is crushed and blended with a binder such as polyvinyl alcohol in a solvent such as water or ethanol, using zirconia balls or similar media and then dried. The powder thus obtained by drying is subjected to uniaxial pressing to form square plaque samples having a size of 12 mm in length, 12 mm in width and 3 mm in thickness. The samples are further subjected to baking in an oxidizing atmosphere at from 950 to 1,200° C. for from 3 to 10 hours. Piezoelectric ceramics from the piezoelectric ceramic composition according to the present invention can be manufactured by these operations. The present invention will be further explained, based on the examples below.

EXAMPLE 1

First, powders of $Ag_2O$, $Nb2O_5$, $Ta_2O_5$ and $Li_2CO_3$ were weighed out and blended together to prepare mixtures having specific compositions according to the values for x and y listed in Table 1. The mixtures were then subjected to calcination in an oxidizing atmosphere at from 850 to 1,100° C. for 10 hours, using an electric furnace. The powders thus obtained were crushed and blended with polyvinyl alcohol such that the polyvinyl alcohol was in an amount of 5 parts by weight based on 100 parts by weight of each powder. Then they were dried and subjected to uniaxial pressing (10 ton/cm$^2$) to form square plaque samples having a size of 12 mm in length, 12 mm in width, and about 2.5 mm in thickness. The samples thus obtained were baked in an oxidizing atmosphere at the temperatures listed in Table 1.

the scopes of some of the preferred embodiments of the present invention.

After that, a Ag paste was applied to the surfaces of the plaque samples, and the samples were baked at 800° C. Then, they were subjected to a polarization treatment by applying a direct-current voltage of from 50 kV/cm to 200 kV/cm in an insulating oil bath at from 100 to 150° C. for from 3 to 10 minutes. Next, square pillars having a size of 2 mm×2 mm×3 mm were cut out using a dicing machine. The samples thus obtained were subjected to measurements of dielectric constant, electromechanical coupling coefficient $k_{33}$ for the thickness vibration, piezoelectric constant $d_{33}$ for the thickness vibration, resonance frequency constant N for the thickness vibration, and transition temperature. The results are shown in Table 2. From Table 2, it is understood that the compositional range according to the present invention provides a good electromechanical coupling coefficient $k_{33}$ of not less than 20%, and a transition temperature of not less than 200° C.

TABLE 2

| Sample No. | Dielectric constant | Coupling coefficient $k_{33}$ (%) | Piezoelectric constant $d_{33}$ (pC/N) | Resonance frequency constant (Hz/m) | Transition temperature (° C.) |
| --- | --- | --- | --- | --- | --- |
| *1 | Measurement failed | Measurement failed | Measurement failed | Measurement failed | 70 |
| **2 | 180 | 21 | 18 | 1,873 | 70 |
| **3 | 194 | 41 | 52 | 2,139 | 150 |
| 4 | 253 | 41 | 55 | 2,089 | 210 |
| 5 | 304 | 41 | 55 | 2,076 | 290 |
| 6 | 284 | 35 | 50 | 2,065 | 310 |
| 7 | 263 | 27 | 41 | 2,073 | 310 |
| 8 | 242 | 21 | 27 | 2,122 | 310 |
| 9 | 232 | 25 | 35 | 2,239 | 320 |
| **10 | 179 | 22 | 31 | 1,956 | 320 |
| 11 | 159 | 44 | 53 | 2,141 | 260 |
| 12 | 154 | 45 | 53 | 2,149 | 250 |
| **13 | 178 | 42 | 50 | 2,188 | 160 |
| 14 | 153 | 39 | 43 | 2,075 | 230 |
| 15 | 154 | 45 | 53 | 2,149 | 210 |
| **16 | 132 | 28 | 38 | 2,052 | 80 |

TABLE 1

| Sample No. | x | y | Baking temperature (° C.) |
| --- | --- | --- | --- |
| *1 | 0.000 | 0.000 | 1,040 |
| **2 | 0.025 | 0.000 | 1,040 |
| **3 | 0.050 | 0.000 | 1,040 |
| 4 | 0.075 | 0.000 | 1,040 |
| 5 | 0.100 | 0.000 | 1,040 |
| 6 | 0.125 | 0.000 | 1,040 |
| 7 | 0.150 | 0.000 | 1,020 |
| 8 | 0.200 | 0.000 | 1,020 |
| 9 | 0.300 | 0.000 | 1,020 |
| **10 | 0.400 | 0.000 | 1,020 |
| 11 | 0.100 | 0.050 | 1,020 |
| 12 | 0.100 | 0.100 | 1,040 |
| **13 | 0.100 | 0.200 | 1,120 |
| 14 | 0.075 | 0.050 | 1,020 |
| 15 | 0.150 | 0.100 | 1,040 |
| **16 | 0.400 | 0.100 | 1,040 |

In all of the Tables herein, the asterisk * indicates that the compositions are out of the scope of the present invention and the mark ** indicates that the compositions are out of

EXAMPLE 2

In a similar way to that applied to Example 1, powders of $Ag_2O$, $Nb_2O_5$, $Ta_2O_5$ and $Li_2CO_3$ were first weighed out and blended together to prepare mixtures having specific compositions according to the values for x and y listed in Table 3. The mixtures were then subjected to calcination in an oxidizing atmosphere at from 900 to 1,200° C. for 10 hours using an electric furnace. powders of $MnCO_3$ and/or $SiO_2$ in an amount shown in Table 3 was added to the powders, and then the powders were blended with polyvinyl alcohol such that the polyvinyl alcohol was in an amount of 5 parts by weight based on 100 parts by weight of each powder. Then they were dried and subjected to uniaxial pressing (10 ton/cm$^2$) to form square plaque samples having a size of 12 mm in length, 12 mm in width and about 2.5 mm in thickness. The samples thus obtained were baked in an oxidizing atmosphere at the temperatures listed in Table 3. After that, a Ag paste was applied to the surfaces of the plaque samples, and the samples were baked at 800° C.

TABLE 3

| Sample No. | x | y | Baking temperature (° C.) | Amount of MnCO₃ added (parts by weight) | Amount of SiO₂ added (parts by weight) |
|---|---|---|---|---|---|
| 17 | 0.075 | 0.000 | 1,020 | 0.2 | 0.0 |
| 18 | 0.075 | 0.000 | 1,000 | 2.0 | 0.0 |
| 19 | 0.100 | 0.000 | 1,009 | 3.0 | 0.0 |
| 20 | 0.100 | 0.000 | 980 | 5.0 | 0.0 |
| **21 | 0.150 | 0.000 | 980 | 6.0 | 0.0 |
| 22 | 0.075 | 0.000 | 1,020 | 0.0 | 0.2 |
| 23 | 0.075 | 0.000 | 1,020 | 0.0 | 2.0 |
| 24 | 0.100 | 0.000 | 1,000 | 0.0 | 3.0 |
| 25 | 0.100 | 0.000 | 980 | 0.0 | 5.0 |
| **26 | 0.150 | 0.000 | 980 | 0.0 | 6.0 |
| 27 | 0.125 | 0.000 | 980 | 0.2 | 0.2 |
| 28 | 0.125 | 0.000 | 980 | 3.0 | 2.0 |
| 29 | 0.100 | 0.050 | 980 | 3.0 | 0.0 |
| 30 | 0.100 | 0.100 | 1,000 | 0.0 | 2.0 |
| **31 | 0.100 | 0.050 | 980 | 6.0 | 0.0 |
| **32 | 0.100 | 0.100 | 1,000 | 0.0 | 6.0 |

After that, they were subjected to a polarization treatment by applying a direct-current voltage of from 50 kV/cm to 200 kV/cm in an insulating oil bath at from 100 to 150° C. for from 3 to 10 minutes. Next, square pillars having a size of 2 mm×2 mm×3 mm were cut out, using a dicing machine. The samples thus obtained were subjected to measurements of dielectric constant, electromechanical coupling coefficient $k_{33}$ for the thickness vibration, piezoelectric constant $d_{33}$ for the thickness vibration, resonance frequency constant N for the thickness vibration, and transition temperature. The results are shown in Table 4. As shown in Table 4, by adding MnCO₃ and/or SiO₂, it is possible to obtain a piezoelectric ceramic composition having a good electromechanical coupling coefficient $k_{33}$ of not less than 20%, which is equivalent to that of a sample without the addition of such a material, having a transition temperature of not less than 200° C. and having a low baking temperature.

TABLE 3

| Sample No. | Dielectric constant | Coupling coefficient $k_{33}$ (%) | Piezoelectric constant $d_{33}$ (pC/N) | Resonance frequency constant (Hz/m) | Transition temperature (° C.) |
|---|---|---|---|---|---|
| 17 | 259 | 40 | 53 | 2,053 | 220 |
| 18 | 263 | 42 | 57 | 2,073 | 215 |
| 19 | 310 | 40 | 54 | 2,081 | 290 |
| 20 | 313 | 43 | 55 | 2,075 | 295 |
| **21 | 292 | 22 | 34 | 1,756 | 305 |
| 22 | 255 | 43 | 57 | 2,016 | 210 |
| 23 | 258 | 41 | 58 | 2,063 | 210 |
| 24 | 316 | 45 | 56 | 2,066 | 295 |
| 25 | 314 | 42 | 53 | 2,032 | 290 |
| **26 | 285 | 23 | 36 | 1,873 | 300 |
| 27 | 294 | 38 | 49 | 2,073 | 315 |
| 28 | 296 | 39 | 53 | 2,072 | 310 |
| 29 | 175 | 42 | 47 | 2,103 | 255 |
| 30 | 163 | 41 | 46 | 2,089 | 245 |
| **31 | 186 | 32 | 42 | 1,898 | 255 |
| **32 | 177 | 34 | 40 | 1,946 | 250 |

Figure 2:
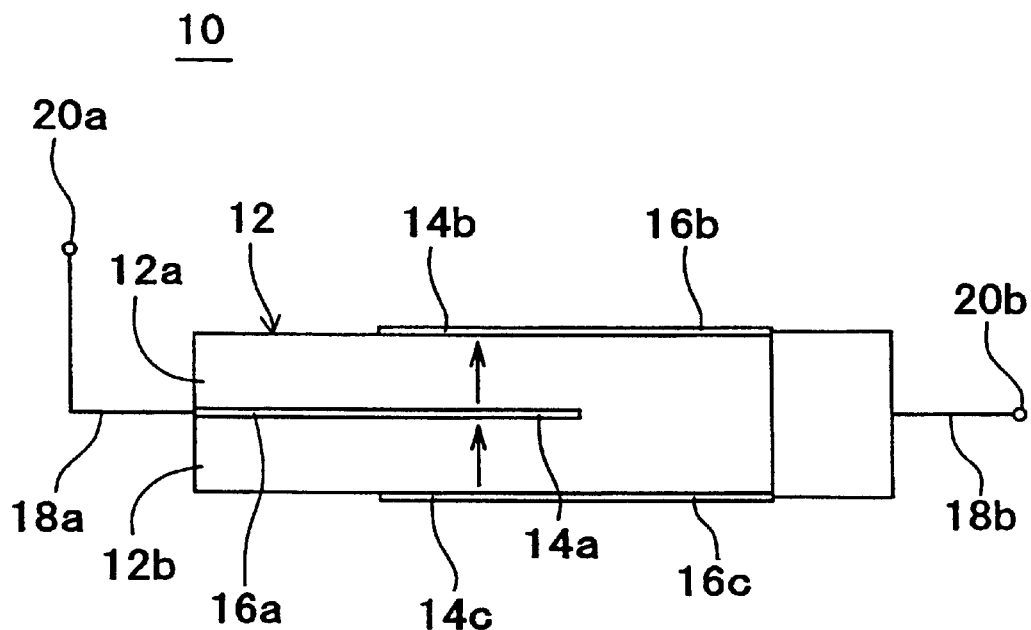
FIG. 2 is a cross-sectional illustrative view of the piezoelectric ceramic resonator shown in FIG. 1.

FIG. 1 is a perspective view showing an example of a piezoelectric ceramic element according to the present invention. FIG. 2 is a cross-sectional view thereof. The piezoelectric ceramic element shown in FIGS. 1 and 2 is a piezoelectric ceramic resonatortor 10. The piezoelectric ceramic resonator 10 comprises a piezoelectric ceramic 12 in a cubic shape, for example. The piezoelectric ceramic 12 comprises two sheets of piezoelectric ceramic layers 12a and 12b. These piezoelectric ceramic layers 12a and 12b are composed of a piezoelectric ceramic composition according to the above-described present invention, and are laminated and consolidated to form a unitary structure. These piezoelectric ceramic layers 12a and 12b are polarized along the same thickness direction as shown by the arrows in FIG. 2.

A vibrating electrode 14a in a circular shape, for example, is placed in between the piezoelectric ceramic layers 12a and 12b, and at the center of the interface. A lead electrode 16a in a T shape, for example, is formed connecting the vibrating electrode 14a and one edge surface of the piezoelectric ceramic 12. A vibrating electrode 14b in a circular shape, for example, is placed at the center of the surface of the piezoelectric ceramic layer 12a. A lead electrode 16b in a T shape, for example, is formed connecting the vibrating electrode 14b and the other edge surface of the piezoelectric ceramic 12. Furthermore, a vibrating electrode 14c in a circular shape, for example, is placed at the center of the surface of the piezoelectric ceramic layer 12b. A lead electrode 16c in a T shape, for example, is formed connecting the vibrating electrode 14c and the other edge surface of the piezoelectric ceramic 12.

Thereafter, the lead electrode 16a is connected to an external electrode 20a via a lead wire 18a, and the lead electrode 16b and 16c are connected to another external electrode 20b via another lead wire 18b.

Hereupon, it is to be noted that the present invention is also applicable to various piezoelectric ceramic resonators other than the above-described piezoelectric ceramic resonator 10 as well as other piezoelectric ceramic elements such as piezoelectric ceramic filters and piezoelectric ceramic oscillators.

According to the present invention, a piezoelectric ceramic composition can be obtained, which provides a large (not less than about 20%) electromechanical coupling coefficient $k_{33}$ in comparison with a bismuth layered compound, without containing Pb, and can therefore be of practical use. Furthermore, by adding at least one of a manganese oxide and a silicon oxide as an auxiliary component to the main component of the piezoelectric ceramic composition according to the present invention, a lower baking temperature can be realized, without degrading various properties such as dielectric constant, electromechanical coupling coefficient $k_{33}$ for the thickness vibration, piezoelectric constant $d_{33}$ for the thickness vibration, resonance frequency constant N for the thickness vibration and transition temperature.

What is claimed is:

1. A piezoelectric ceramic composition comprising a main component comprising at least the elements Ag, Li, Nb and O, and having an electromechanical coupling coefficient $k_{33}$ of not less than about 20%, and further comprising at least one of a manganese oxide and a silicon oxide as an auxiliary component.

2. A piezoelectric ceramic composition according to claim 1 wherein said manganese oxide is in an amount of not more than about 5 parts by weight based on 100 parts by weight of said main component, and wherein said silicon oxide is in an amount of not more than about 5 parts by weight based on 100 parts by weight of said main component.

3. A piezoelectric ceramic composition comprising a main component comprising at least the elements Ag, Li, Nb and O, and having an electromechanical coupling coefficient $k_{33}$ of not less than about 20% in which the main component is represented by the general formula $(Ag_{1-x}Li_x)(Nb_{1-y}Ta_y)O_3$, wherein $0.075 \leq x < 0.40$ and $0 \leq y < 0.20$.

4. A piezoelectric ceramic composition according to claim 3, comprising at least one of a manganese oxide and a silicon oxide as an auxiliary component.

5. A piezoelectric ceramic composition according to claim 4, wherein said manganese oxide is in an amount of not more than about 5 parts by weight based on 100 parts by weight of said main component, and wherein said silicon oxide is in an amount of not more than about 5 parts by weight based on 100 parts by weight of said main component.

6. A piezoelectric ceramic composition comprising a main component represented by the general formula $(Ag_{1-y}Li_x)NbO_3$, wherein $0.075 \leq x < 0.40$, and having an electromechanical coupling coefficient $k_{33}$ of not less than about 20, and further comprising at least one of a manganese oxide and a silicon oxide as an auxiliary component.

7. A piezoelectric ceramic composition according to claim 6, wherein said manganese oxide is in an amount of not more than about 5 parts by weight based on 100 parts by weight of said main component, and wherein said silicon oxide is in an amount of not more than about 5 parts by weight based on 100 parts by weight of said main component.

8. A piezoelectric ceramic composition according to claim 1 in which the main component is represented by the general formula $(Ag_{1-x}Li_x)(Nb_{1-y}Ta_y)O_3$, wherein $0.075 \leq x < 0.40$ and $0 < y < 0.20$.

9. A piezoelectric ceramic composition according to claim 8, wherein said manganese oxide is an amount of not more than about 5 parts by weight based on 100 parts by weight of said main component, and wherein said silicon oxide is in an amount of not more than about 5 parts by weight based on 100 parts by weight of said main component.

10. A piezoelectric ceramic comprising a polarized piezoelectric ceramic composition according to claim 8.

11. A piezoelectric ceramic comprising a polarized piezoelectric ceramic composition according to claim 6.

12. A piezoelectric ceramic comprising a polarized piezoelectric ceramic composition according to claim 3.

13. A piezoelectric ceramic element comprising a piezoelectric ceramic according to claim 12 having an electrode thereon.

14. A piezoelectric ceramic element comprising a piezoelectric ceramic according to claim 11 having an electrode thereon.

15. A piezoelectric ceramic element comprising a piezoelectric ceramic according to claim 10 having an electrode thereon.

* * * * *